United States Patent
Watanabe et al.

(10) Patent No.: US 8,182,649 B2
(45) Date of Patent: May 22, 2012

(54) FIXED JIG, CHIP PICKUP METHOD AND CHIP PICKUP APPARATUS

(75) Inventors: Kenichi Watanabe, Tokyo (JP); Takeshi Segawa, Tokyo (JP); Hironobu Fujimoto, Tokyo (JP)

(73) Assignee: Lintec Corporation, Tokyo (JP)

( * ) Notice: Subject to any disclaimer, the term of this patent is extended or adjusted under 35 U.S.C. 154(b) by 336 days.

(21) Appl. No.: 12/445,697

(22) PCT Filed: Oct. 12, 2007

(86) PCT No.: PCT/JP2007/070010
§ 371 (c)(1),
(2), (4) Date: Apr. 15, 2009

(87) PCT Pub. No.: WO2008/047732
PCT Pub. Date: Apr. 24, 2008

(65) Prior Publication Data
US 2010/0314894 A1  Dec. 16, 2010

(30) Foreign Application Priority Data
Oct. 18, 2006  (JP) .................................. 2006-283984

(51) Int. Cl.
*B32B 38/10* (2006.01)
(52) U.S. Cl. ........ 156/707; 156/714; 156/758; 156/764; 156/941; 269/21
(58) Field of Classification Search .................. 156/707, 156/714, 758, 764, 931, 941; 269/21; 206/460, 206/524.8; 248/363
See application file for complete search history.

(56) References Cited

U.S. PATENT DOCUMENTS

| | | | |
|---|---|---|---|
| 4,778,326 | A | 10/1988 | Althouse et al. |
| 7,300,818 | B2 | 11/2007 | Kurosawa et al. |
| 2002/0178567 | A1 | 12/2002 | Farnworth et al. |
| 2004/0038498 | A1 | 2/2004 | Ozono et al. |
| 2004/0091342 | A1 | 5/2004 | Yajima et al. |

FOREIGN PATENT DOCUMENTS

| | | |
|---|---|---|
| JP | 11054594 A | 2/1999 |
| JP | 2003088982 A | 3/2003 |
| JP | 2003179126 A | 6/2003 |
| JP | 2003229469 A | 8/2003 |
| JP | 2004152858 A | 5/2004 |
| JP | 2004311880 A | 11/2004 |

OTHER PUBLICATIONS

Takaoka Hidetsugu, "Principle and Features of Stealth Dicing Technology: Optimal for Dicing Ultra-thin Semiconductor Wafers", Electronic Materials, Sep. 2002, pp. 17-21, and English Abstract thereof.

*Primary Examiner* — Mark A Osele
(74) *Attorney, Agent, or Firm* — The Webb Law Firm

(57) ABSTRACT

It is an object to provide a fixing jig which can unmovably suction a chip group produced by segmenting a semiconductor wafer into pieces, and can suction one chip by detaching the chip selectively and reliably from the chip group. A fixing jig 3 is composed of a jig base 30 and an contact layer 31. A concave part 2 is formed on one side of the jig base 30. The concave part 2 is sectioned into small chambers 15 by a partition 12 having a height almost equivalent to that of a sidewall 35. The contact layer 31 is disposed on the upper edge of the sidewall 35 and the partition 12 for covering the concave part 2. A through hole 17 that is communicated with the outside is formed in each small chamber 15.

3 Claims, 6 Drawing Sheets

FIXED JIG, CHIP PICKUP METHOD AND CHIP PICKUP APPARATUS

TECHNICAL FIELD

The present invention relates to a fixing jig for fixing a chip group in a wafer shape produced by segmenting a semiconductor wafer into pieces, and a pickup method and a pickup apparatus in which the pushing up of a chip is not carried out. More specifically, the present invention relates to a fixing jig, a chip pickup method and a chip pickup apparatus in which a comparatively large-area semiconductor chip that has been ground to be extremely thin can be picked up individually without damage.

BACKGROUND ART

In recent years, an IC card and a mobile electronic device has become popular and much further thinning of a semiconductor component has been desired. Consequently, a conventional semiconductor chip having a thickness of approximately 350 μm has to be further thinner to be in the range of 50 to 100 μm or less.

To form a semiconductor chip, after a front surface circuit formation is carried out, a predetermined thickness of the semiconductor chip is ground from a rear face, and a dicing is carried out for every circuit. As another method, after a surface circuit formation is carried out, a groove having a depth more than a predetermined depth from a circuit surface is formed, and a rear face is ground in such a manner that a semiconductor chip has a predetermined thickness (dicing before grinding method) to form a semiconductor chip.

A semiconductor chip that has been fixed on a pressure sensitive adhesive sheet such as a dicing sheet to prevent chips from being separated is brought to a pickup process. In the case in which a chip on the pressure sensitive adhesive sheet is picked up, the pressure sensitive adhesive sheet under the rear face of the chip is pushed up by means of a fine needle to reduce an area of contact with the pressure sensitive adhesive sheet. The chip that has been pushed up by a fine needle is sucked by means of a suction collet from the upper surface side of the chip, and is detached from the pressure sensitive adhesive sheet. The chip is then transferred to a die pad of a chip substrate or the like.

Since a chip has been thinned, the pushing up of a chip by means of a fine needle delivers a considerable damage to the chip. A semiconductor device in which a chip that has been damaged is used possesses lower reliability, for instance, a package crack occurs by receiving a heat history. In addition, in the case in which the damage suffered is serious, a chip may be broken due to the pushing up of the chip in some cases.

To solve such problems, a pickup method in which the pushing up of a chip by means of a fine needle is not carried out is studied (Japanese Patent Application Laid-Open Publication No. 2003-179126 (see Patent document 1)). In the pickup method, a suction table of a porous material is used in place of a pressure sensitive adhesive tape, and a suction of a suction table is stopped to cancel the holding force of a chip in the case in which a chip is picked up. However, in this method, a gap between chips cannot be sealed and an air leaks. Moreover, a leak amount increases as a chip is picked up. By this, a holding force to a remaining chip that is not picked up is reduced, and a location of a chip is out of alignment by a vibration, whereby a collet cannot catch a chip.

Patent document 1: Japanese Patent Application Laid-Open Publication No. 2003-179126

The present invention was made in consideration of the above problems, and an object of the present invention is to provide a fixing jig which can unmovably suction a chip group produced by segmenting a semiconductor wafer into pieces, and can suction one chip by detaching the chip selectively and reliably from the chip group.

Another object of the present invention is to provide a pickup method wherein the pushing up of a chip is not required and a force for holding a chip that is not picked up is not varied as a pickup is progressed to pick up the chip reliably and a pickup apparatus suitable for achieving the pickup method by using the above fixing jig.

SUMMARY OF THE INVENTION

A fixing jig in accordance with the present invention is characterized by comprising a jig base and an contact layer, wherein a concave part is formed on one side of the jig base, the concave part is sectioned into small chambers by a partition having a height almost equivalent to that of a sidewall, the contact layer is disposed on the upper edge of the sidewall and the partition for covering the concave part, and a through hole that is communicated with the outside is formed in each small chamber.

By the fixing jig having the above configuration, a suction force of a chip that is suctioned to the jig base via the contact layer can be selectively canceled.

A method for picking up a chip fixed to the fixing jig described above in accordance with the present invention is characterized by comprising the steps of:

fixing a chip in a state in which a chip group in a wafer shape is fixed to the contact layer;

deforming the contact layer that covers an aimed small chamber by suctioning an air in the small chamber through the through hole of the small chamber in the fixing jig; and suctioning the chip on the section in which the small chamber is suctioned and the contact layer is deformed by means of a suction collet to pick up the suctioned chip completely from the contact layer.

By the pickup method described above, a chip can be selectively picked up by suctioning an air in an independent small chamber in the fixing jig.

A pickup apparatus that is used in the chip pickup method described above in accordance with the present invention is characterized by comprising:

a suction means that is disposed on one opening side of the through hole formed in a thickness direction of the jig base;

a suction collet that is disposed on the other opening side of the through hole; and a table in a doughnut shape that detachably fixes the outer circumference of the jig base, wherein the suction means suctions any of the small chamber in the jig base that is detachably held by the table in a doughnut shape and the suction collet suctions a chip.

For the chip pickup apparatus having the above configuration in accordance with the present invention, the suction is carried out via a through hole of a corresponding small chamber among a plurality of small chambers in the fixing jig to which the chip contacts whereby the small chamber is depressurized. The corresponding section of the contact layer is drawn to the bottom side of the table by the depressurization. An ambient air then flows between the chip and the surface of the contact layer from the periphery of the chip to cause the chip to be detached from the contact layer. Consequently, only the upper face on the partition contacts to the chip. Therefore, an individual chip can be picked up by suctioning the chip from the opposite side with the suction collet.

Even in the case in which chips are picked up by the suction collet continuously, a contact state with a chip that remains on the fixing jig does not vary due to a leak of an air. Consequently, each chip can be fixed to the fixing jig with a stable small contact force at any time, and therefore displacement is prevented until the last chip.

A chip can be picked up in the following manner by the fixing jig in accordance with the present invention. A concave part formed on one side of the jig base is sectioned into small chambers by a partition. Consequently, when the contact layer on a small chamber is deformed by suctioning a through hole of the small chamber, a chip on the corresponding section can be detached from the contact layer. Thus the chip can be picked up.

By the chip pickup method and the chip pickup apparatus in accordance with the present invention, the chip can be picked up by only the suction force of the suction collet without the pushing up of the rear face of the chip using a fine needle. Consequently, the chip is not damaged.

Moreover, even for a chip that has been processed to be extremely thin, an individual chip can be reliably picked up and safely transferred to the next step.

Furthermore, by the chip pickup method and the chip pickup apparatus in accordance with the present invention, even in the case in which the suction collet picks up chips continuously, an adhesion state with a chip that remains on the fixing jig does not vary due to a leak of an air. Consequently, each chip can be fixed to the fixing jig with a stable small contact force at any time, therefore enabling each chip to be picked up without a displacement of the chip.

BEST MODE OF CARRYING OUT THE INVENTION

An embodiment of the present invention will be described below in detail with reference to the drawings.
<Fixing Jig>
At first, a fixing jig that is used for the present invention will be described below.

Figure 1:
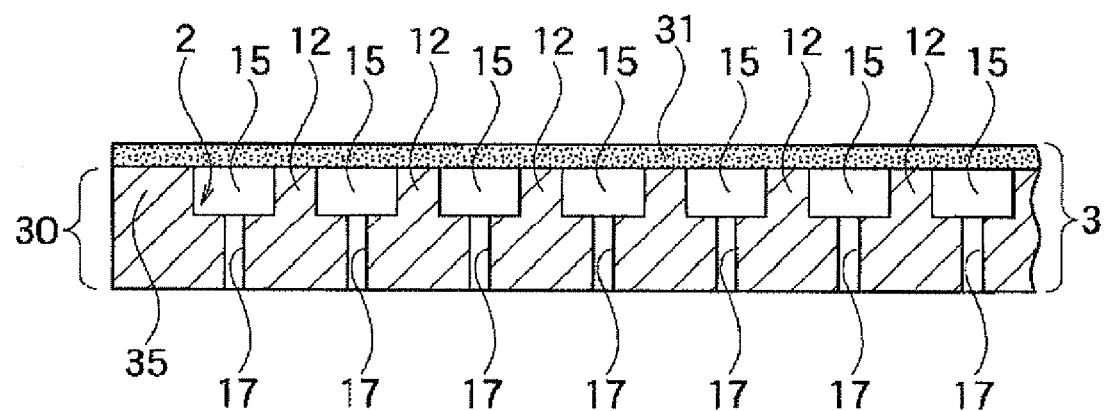
FIG. 1 is a schematic cross-sectional view showing a fixing jig that is used in a pickup apparatus for carrying out a pickup method in accordance with the present invention.

FIG. 1 shows a fixing jig in accordance with the present invention. The fixing jig is built in the pickup apparatus in accordance with the present invention to be used.

Figure 2:
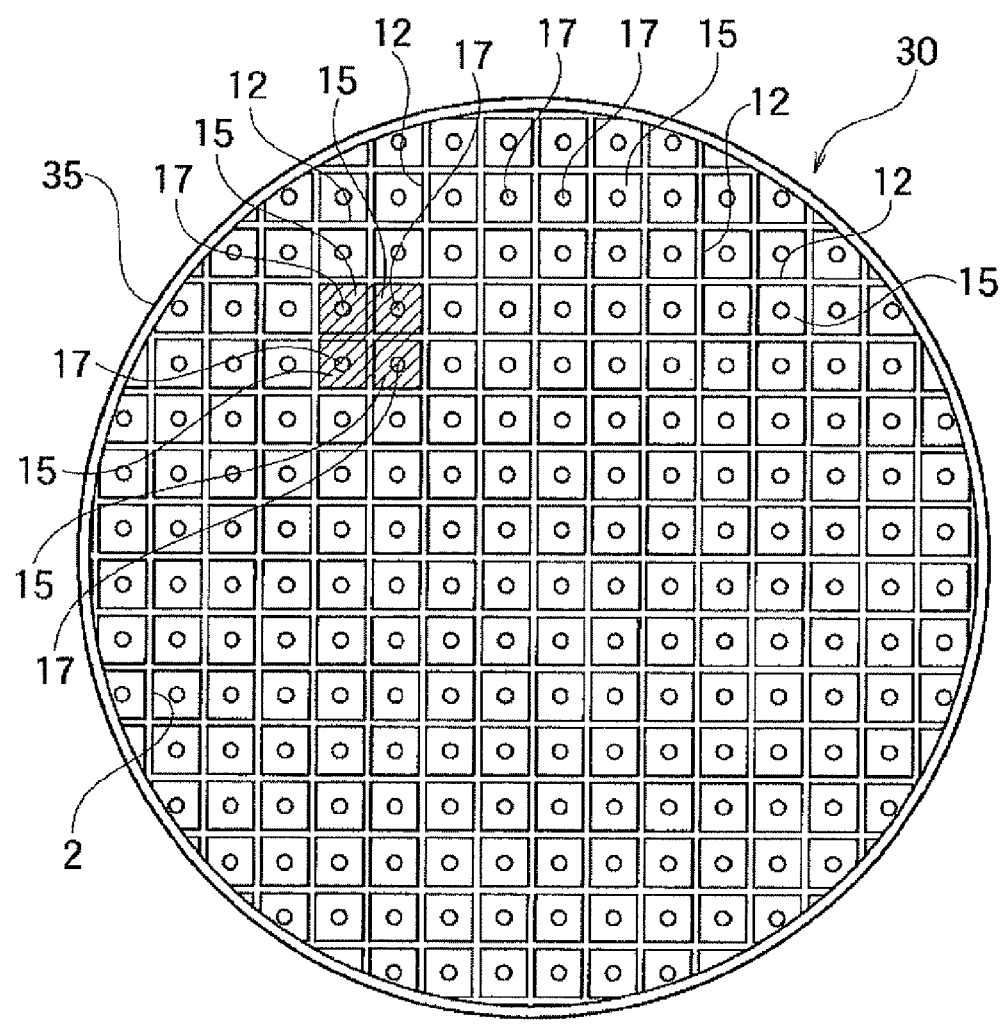
FIG. 2 is a schematic plan view showing a jig base that configures a fixing jig in the fixing jig shown in FIG. 1.

As shown in FIG. 1, a fixing jig 3 in accordance with the present invention is composed of a jig base 30 and an contact layer 31. As a shape of the jig base 30, there can be mentioned for instance an approximately circular shape, an approximately elliptical shape, an approximately rectangular shape, and an approximately polygonal shape, and an approximately circular shape as shown in FIG. 2 is preferable. A sidewall 35 is formed on the outer circumference section on one side of the jig base 30. A circular concave part 2 is formed inside the sidewall 35 on one side of the jig base 30. As shown in FIGS. 1 and 2, a partition 12 is formed in a lattice pattern, that is, lengthwise and crosswise. By this configuration, the concave part 2 is sectioned into a plurality of small chambers 15 by a partition 12. A height of the partition 12 is set to almost equivalent to that of the sidewall 35 in the jig base 30.

The lengthwise and crosswise intervals between the partitions 12 disposed in a lattice pattern is arbitrary, but can be properly specified based on a size of the chip. As an interval between the partitions 12 is smaller, kinds of sizes of a chip that can be picked up can be increased.

As shown in FIG. 2, a through hole 17 is formed in at the center part of each small chamber 15.

In addition, the contact layer 31 in a sheet shape is laminated on the surface of the jig base 30 provided with the partitions 12. The contact layer 31 is bonded to the upper face of the partitions 12 and the sidewall 35, whereby adjacent small chambers are isolated in an air sealing state from each other.

Figure 4:
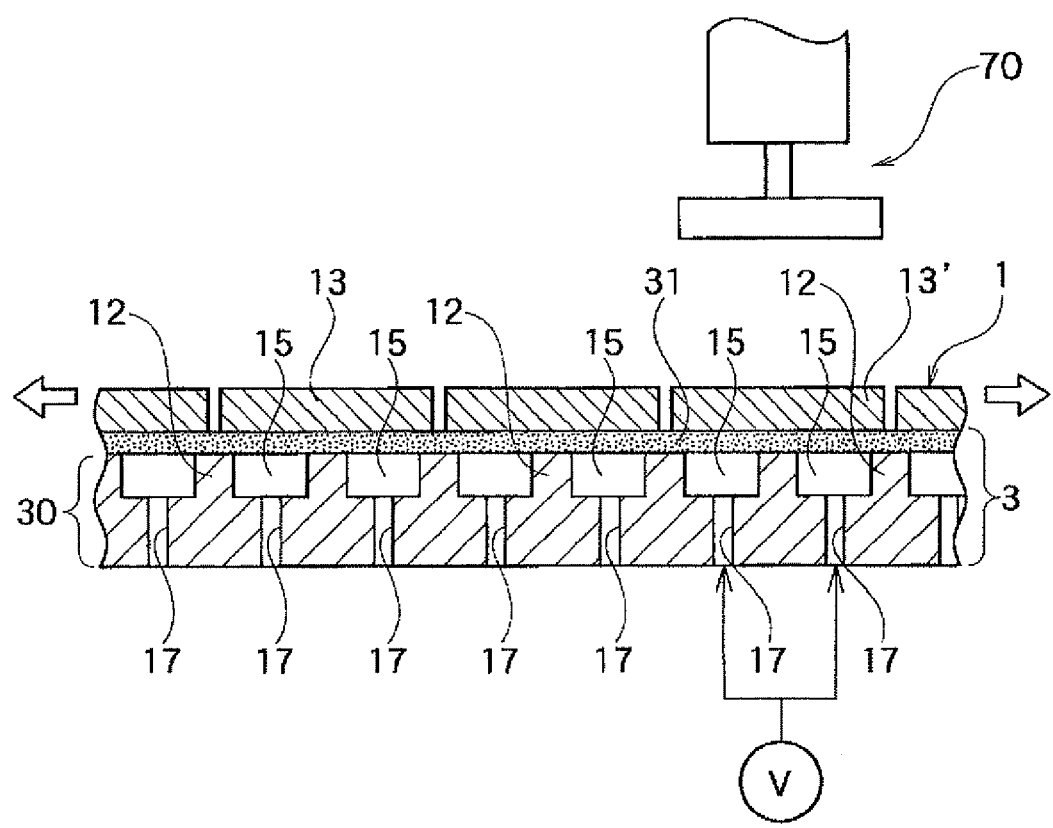
FIG. 4 is a schematic cross-sectional view showing a state in which the semiconductor wafer that has been segmented into chip pieces is disposed on a fixing jig before a pickup operation.

For instance, a chip group produced by segmenting a semiconductor wafer into pieces is moved in a horizontal direction of the paper face as shown in FIG. 4. The predetermined through holes 17 (four through holes in the case of the present embodiment) are disposed on a vacuum apparatus V used as a suction means, and the suction parts of the vacuum apparatus V are connected to the four through holes 17, thereby enabling four small chambers 15 to be depressurized. In the case of the present embodiment, since one chip 13 is disposed over the four small chambers 15 as shown by diagonal lines in FIG. 2, the four small chambers 15 are depressurized simultaneously.

Figure 5:
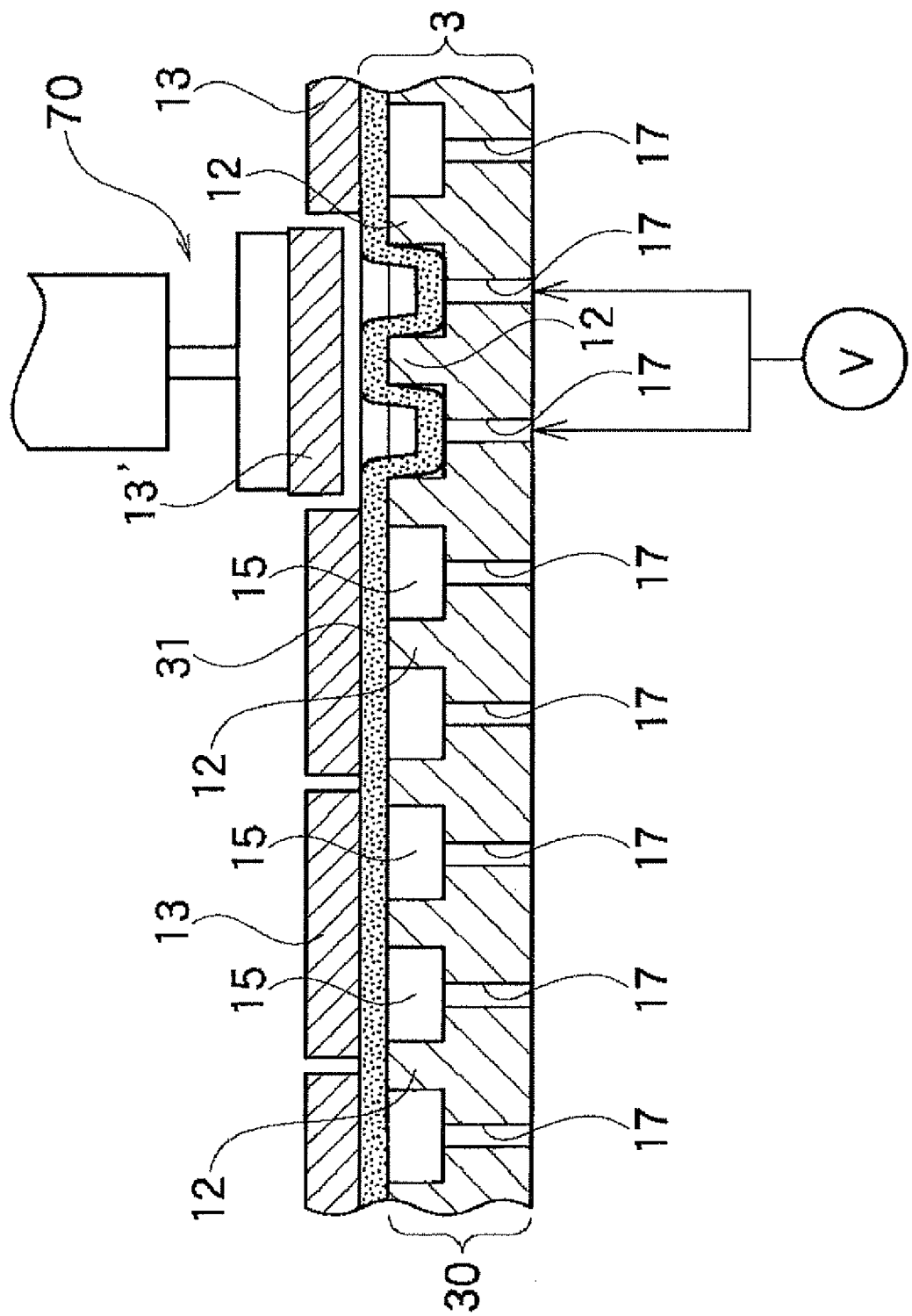
FIG. 5 is a schematic cross-sectional view showing at the time when a chip is picked up from the fixing jig shown in FIG. 4.

As described above, in the case in which the four small chambers 15 are suctioned, the contact layer 31 sections corresponding to the four small chambers 15 are deformed in a concave-convex shape. Consequently, the chip 13' that has contacted to the deformed sections of the contact layer 31 is detached from the contact layer 31. Therefore, by suctioning the chip 13' by a suction collet 70 from the upper side of the contact layer 31, the detached chip 13' can be picked upward as shown in FIG. 5.

The material of the jig base 30 is not restricted in particular in the case in which the jig base 30 has a large mechanical strength. As the material of the jig base 30, there can be mentioned for instance a thermoplastic resin such as polycarbonate, polypropylene, polyethylene, a polyethylene terephthalate resin, an acrylic resin, and polyvinyl chloride, and a metallic material such as an aluminum alloy, a magnesium alloy, and stainless steel, and an inorganic material such as glass, and an organic/inorganic composite material such as a glass fiber reinforced epoxy resin. It is preferable that a modulus of elasticity in bending for the jig base 30 is at least 1 GPa.

In the case in which the jig base 30 has such modulus of elasticity in bending, the jig base 30 can have stiffness even if a thickness of the jig base is not more than necessary. By using such material, a wafer can be sufficiently supported without bending the wafer after grinding the rear face of the wafer. Moreover, the jig base 30 has hardness against a shearing stress caused by a rotation of an abrasive grind wheel for the semiconductor wafer, thereby preventing from being disarranged a layout of the chips after the dicing before grinding process.

It is preferable that an outside diameter of the jig base 30 is almost equivalent to or larger than that of a semiconductor wafer. In the case in which the jig base 30 has an outside diameter that can correspond to the maximum diameter of a standardized size of a semiconductor wafer (for instance 300 mm diameter), the jig base 30 can be applied to all of semiconductor wafers having a diameter smaller than the maximum diameter of a standardized size. Moreover, it is preferable that a thickness of the jig base 30 is in the range of 0.5 to 2.0 mm, more preferably in the range of 0.5 to 0.8 mm. In the case in which a thickness of the jig base is in the above range, a wafer can be held without bending the wafer after grinding the rear face of the wafer. A shape of the small chamber 15 is not restricted in particular. For instance, the small chamber 15 can be in a polygon shape such as a lattice pattern and a honeycomb geometry, or in a circular shape, preferably in a lattice pattern. In the case in which the small chambers 15 are in a lattice pattern, a size of the small chamber 15 is not restricted in particular providing the small chamber 15 is smaller than a chip to be fixed. One side of the small chamber 15 is preferably in the range of 0.5 to 5 mm.

It is preferable that a height of the partition 12 and the sidewall 35 is in the range of 0.05 to 0.5 mm. Moreover, it is preferable that a diameter of the upper face of the partition 12 is in the range of 0.2 to 0.6 mm. In the case in which a size of the partition 12 is in the above range, the contact layer 31 on the small chamber 15 can be deformed sufficiently in a concave-convex shape due to a deaeration in the small chamber 15, and one segmented semiconductor chip 13 can be easily detached from the contact layer 31. Moreover, the contact layer 31 can be restored to an original flat state even after a concavoconvex deformation of the contact layer 31 is repeated many times.

A diameter of the through hole 17 for suctioning a chip is not restricted in particular providing the diameter of the through hole 17 is smaller than a size of the small chamber 15. However, it is preferable that a diameter of the through hole 17 is 2 mm or less.

For the jig base 30, the bottom part, the sidewall 35, and the partition 12 of the jig base 30 can be produced in an integrated manner by heat molding of materials made of thermoplastic resin using a mold. Alternatively, the jig base 30 can be produced by forming the sidewall 35 and the partition 12 on a flat circular plate. As a forming method of the partition 12, there can be mentioned for instance a method for depositing metal in a prescribed shape by electroforming, a method for forming the partition 12 by screen printing, and a method for laminating a photoresist on a flat circular plate and for forming the partition 12 by an exposure and a development. Moreover, the jig base 30 can also be produced by a method for eroding and removing the surface of a metallic flat circular plate by etching while leaving the sidewall and the partition parts and a method for removing the surface of a flat circular plate by sand blasting while leaving the sidewall and the partition parts. The through hole 17 can be formed in advance before forming the small chamber 15. Alternatively, the through hole 17 can be formed after forming the small chamber 15. Alternatively, the through hole 17 can be formed at the same time when the jig base is molded.

As a material of the contact layer 31 disposed on the jig base 30, there can be mentioned for instance an elastomer of urethane series, acrylic series, fluororesin series, or silicone series, which is excellent for pliability, flexibility, heat resisting properties, elasticity, and adherence properties. The addition agents of various kinds such as a reinforcing filler and hydrophobic silica can be added to the elastomer as needed.

It is preferable that the contact layer 31 is a flat plate in a shape almost equivalent to that of the jig base 30. It is preferable that an outside diameter of the contact layer 31 is almost equivalent to that of the jig base 30. It is preferable that a thickness of the contact layer 31 is in the range of 20 to 200 µm. In the case in which a thickness of the contact layer 31 is less than 20 µm, a mechanical durability to repeated suctions becomes less in some cases. On the other hand, in the case in which a thickness of the contact layer 31 exceeds 200 µm, it takes a long time for a detachment caused by suction disadvantageously.

It is preferable that the tensile break strength of the contact layer 31 is at least 5 MPa and a breaking elongation of the contact layer 31 is at least 500%. In the case in which the tensile break strength and a breaking elongation are in the above ranges, the contact layer 31 is not broken and not loosened, and the contact layer 31 can be restored to an original flat state even if a deformation of the contact layer 31 is repeated many times.

It is preferable that a modulus of elasticity in bending for the contact layer 31 is in the range of 10 to 100 MPa. In the case in which a modulus of elasticity in bending for the contact layer 31 is less than 10 MPa, a part other than a contact point of the contact layer 31 with the partition 12 undergoes a bend due to gravity, whereby the contact layer 31 cannot contact to the wafer in some cases. On the other hand, in the case in which a modulus of elasticity in bending for the contact layer 31 exceeds 100 MPa, a deformation caused by suction is hard to occur, and the wafer cannot be easily detached in some cases.

It is preferable that a shearing force for contact to a face on the side that comes into attaching to a semiconductor wafer for the contact layer 31 is at least 35 N. In the present invention, a shearing force is a value that is measured between the contact layer 31 and a mirror face of a silicon wafer. The contact layer 31 is bonded to a well-known glass plate having a size of 30 mm long, 30 mm wide, and 3 mm thick, and the glass plate is disposed on a mirror wafer composed of silicon. In the case in which a load of 900 g is applied to the entire of a glass plate and the contact layer 31 for 5 seconds and the glass plate is pressed while applying a load in parallel to the mirror wafer, a load is measured when the glass plate starts to move.

Moreover, it is preferable that a contact force of the contact layer 31 is 2N/25 mm or less. In the case in which a contact force of the contact layer 31 exceeds 2N/25 mm, a contact between the contact layer 31 and a chip disposed on the contact layer is too strong, thereby causing a blocking state. Consequently, a detachment of a chip due to suction may be impossible. A contact force in accordance with the present invention is detachment strength in the case in which the contact layer 31 is mounted to a mirror face of a wafer and is detached.

The contact layer 31 can be formed by fabricating a film made of the above elastomer in advance based on a process such as a calendar method, a pressing method, a coating method, and a printing method, and by bonding the elastomer film on the upper face of at least the sidewall 35 of the jig base 30. As a method for bonding the contact layer 31, there can be mentioned for instance a method for bonding the contact layer 31 through an adhesive made of a resin such as an acrylic resin, a polyester resin, an epoxy resin, a silicone resin, and an elastomer resin, and a method for bonding the contact layer 31 through a heat seal in the case in which the contact layer 31 has heat sealing characteristics.

An un-sticking treating can be applied to the surface of the contact layer 31. In particular, it is preferable that an un-sticking treating is applied to only the surface that comes into contact with a semiconductor chip in the case in which the contact layer 31 is deformed in a concave-convex shape for the contact layer on the partition 12. By this treating, a surface part to which an un-sticking treating is not applied for the contact layer contacts to a semiconductor chip before the contact layer 31 is deformed, and only the surface over the partition 12, that is, an un-sticking convex surface comes into contact with a semiconductor chip in the case in which the contact layer 31 is deformed in a concave-convex shape. Consequently, a semiconductor chip can be further easily detached from the contact layer 31. As an un-sticking treating method, there can be mentioned for instance a method for deforming the contact layer 31 in a concave-convex shape by suctioning an air in the small chamber 15 using a vacuum apparatus and for physically roughening the end of the convex part using a grind stone roller or the like, an ultraviolet treatment method, a method for laminating a non-adhesive rubber, and a method for coating anon-adhesive paint. A treating part can also be formed in a cross shaped pattern passing through the center of the contact layer 31 (not the above convex part). For a surface roughness of a treating part, an arithmetic mean roughness Ra is preferably at least 1.6 µm, more preferably in the range of 1.6 to 12.5 µm. In the case in which a treating part is roughened based on a surface roughness in the above range, the contact layer 31 is not deteriorated, and a semiconductor chip can be easily detached from the contact layer 31.

<Semiconductor Chip>

Figure 3:
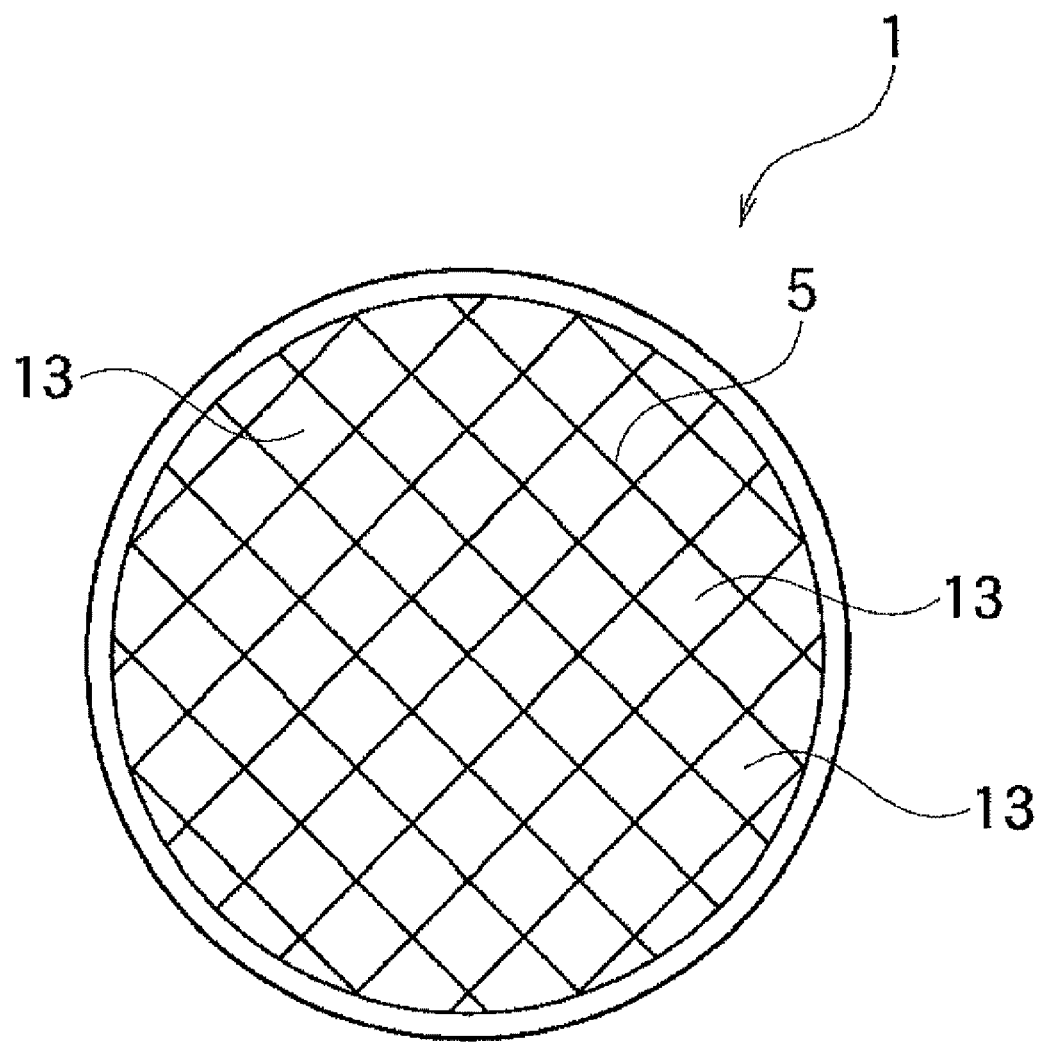
FIG. 3 is a schematic plan view showing a semiconductor wafer in which chip pieces are segmented and processed by the pickup apparatus in accordance with the present invention.

As shown in FIG. 3, a processed body that is picked up in the present invention is a semiconductor wafer 1 that has been diced in a cube pattern by a cutting line 5 through a dicing process. By the above process, the semiconductor wafer 1 is segmented into a plurality of chips 13 in advance.

As shown by diagonal lines in FIG. 2, a size of the four small chambers 15 separated by the lengthwise and crosswise partitions 12 is corresponded to a size of one chip 13 shown in FIG. 3.

A circuit is formed on a silicon semiconductor wafer or a gallium arsenide semiconductor wafer, and so on, and chip pieces are segmented from the wafer to obtain the chip 13. However, the semiconductor wafer is not restricted to the above embodiment. The semiconductor wafers of many kinds can also be used. A circuit can be formed on a wafer surface by various methods such as an etching process and a liftoff process.

As shown in FIG. 4, the semiconductor wafer 1 in which a plurality of chips 13 is separated is then disposed on the fixing jig 3.

A means for achieving the state in which the semiconductor wafer 1 in which a great number of chips 13 is separated is mounted on the contact layer 31 of the fixing jig 3 is not restricted in particular. Providing the state shown in FIG. 4 can be achieved as a result, any steps can be processed.

For instance, the semiconductor wafer can be diced using a normal dicing sheet, and can be transferred to the contact layer 31. Therefore, chips 13 can maintain a wafer shape on the contact layer 31. Moreover, the contact layer 31 can be used as a dicing sheet, and only the semiconductor wafer 1 can be diced without cutting the contact layer 31. Furthermore, in place of a dicing apparatus provided with a dicing blade, a dicing apparatus based on laser beams (laser dicer) can also be used. For the laser dicer, a focal point of laser beams is controlled to divide a wafer, thereby enabling easy control not to cut the contact layer 31 together.

Moreover, a dicing can be carried out by a method that is known as a so-called stealth dicing method. For the stealth dicing method, only the inside of a wafer is focused on to irradiate a laser, a focus part is degenerated, and the locus is broken by a stress for a chip separation. Consequently, the contact layer 31 cannot be cut simultaneously. As a result, this method is effective in particular.

For the stealth dicing method, in the semiconductor wafer, a brittle part is formed along a line to be cut that lays out each circuit of the semiconductor wafer. In this state, the chip groups are connected to each other via the brittle part, and maintain a wafer shape as a whole. The brittle part is formed by focusing on the inside of the semiconductor wafer to irradiate a laser beam along a line to be cut. By irradiating a laser beam, the inside of the wafer is locally heated and degenerated due to a variation of a crystal structure. The degenerated part is put under the excess stress state as compared with peripheral parts, and is potentially weak. Consequently, in the case in which a stress is loaded to the semiconductor wafer, a crack is grown in a vertical direction of the wafer from the brittle part as a starting point, and the wafer can be segmented into chips.

The details of the stealth dicing method are described in "Electronic Materials, September 2002, pages 17 to 21" and Japanese Patent Application Laid-Open Publication No. 2003-88982, the contents of which are incorporated herein by reference.

In the case in which a wafer is segmented into chips by the stealth dicing method as described above, the wafer can be segmented into chips simultaneously with an expand. A tensile force for stretching the adhesive sheet during the expand is transmitted to the wafer fixed on the adhesive sheet. In the case in which a brittle part has been formed in the wafer in this case, the brittle part cannot resist the tensile force, and a subsidiary fracture occurs in the brittle part. As a result, a crack is generated in a vertical direction of the wafer from the brittle part as a starting point, and the wafer can be segmented into chips.

Moreover, a so-called pre-dicing can be applied. More specifically, a groove having a cut depth smaller than a thickness of the wafer is formed from the surface of the wafer on which a semiconductor circuit has been formed, and a surface protection sheet is adhered to the circuit face. The rear face of the semiconductor wafer is then ground to reduce the thickness of the wafer, and chips 13 are separated from each other finally. A grinding surface is made contact with the contact layer 31, and surface protection sheet is removed. Consequently, a state in which a plurality of chips 13 is arranged in a wafer shape on the contact layer 31 can be achieved.

<Pickup Apparatus>

Figure 6:
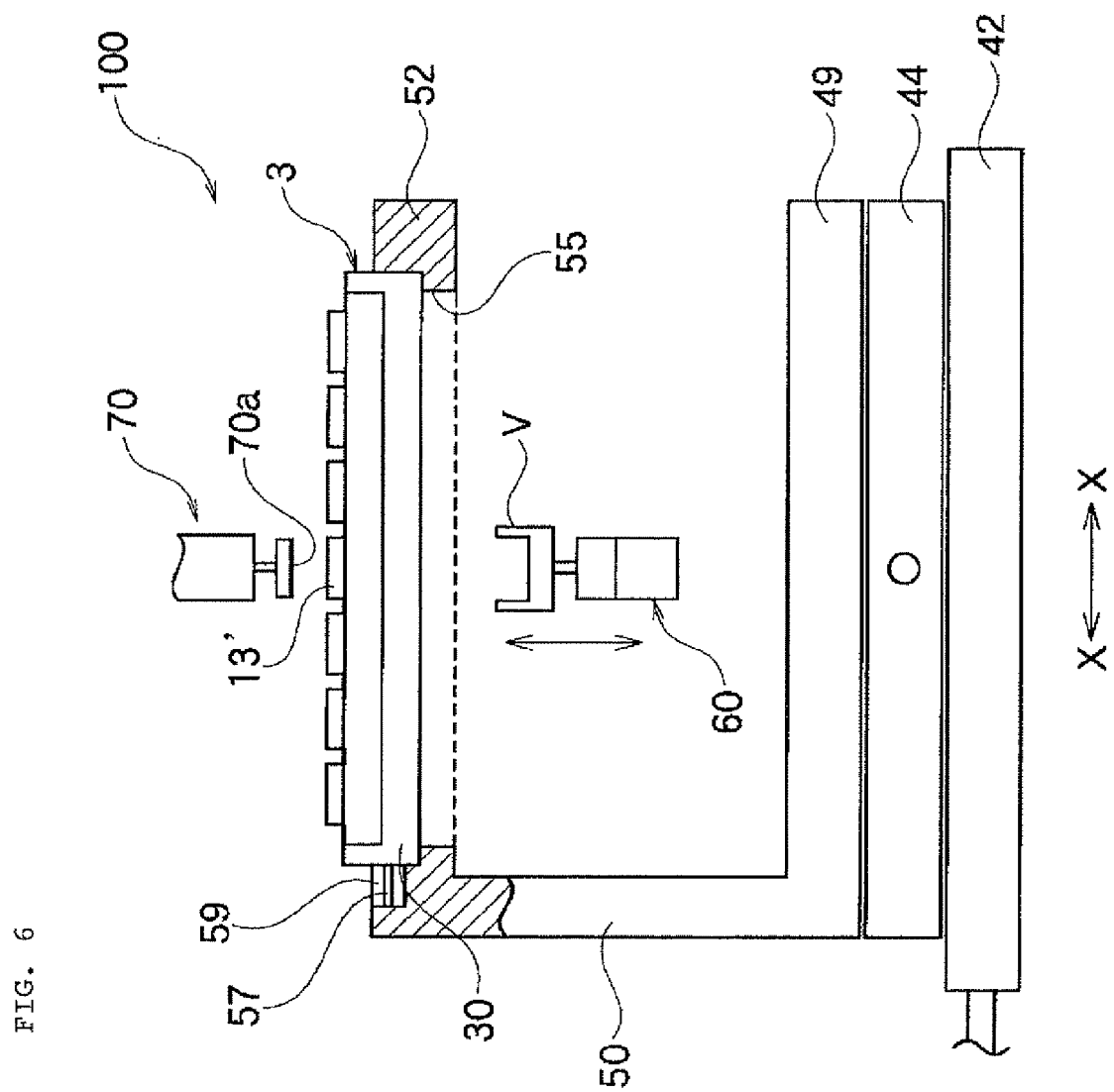
FIG. 6 is a schematic elevational view showing the pickup apparatus suitable for carrying out a pickup method in accordance with the present invention.

FIG. 6 is a view showing a pickup apparatus 100 in accordance with an embodiment of the present invention.

For the pickup apparatus 100 in accordance with an embodiment of the present invention, each of the chips 13 can be picked up without the pushing up using a fine needle.

For the pickup apparatus 100 in accordance with an embodiment of the present invention, a chip group in a wafer shape is fixed to the contact layer 31 of the fixing jig 3, the contact layer 31 is deformed, and the chip group can be picked up by a suction collet.

The summary of the pickup apparatus 100 for carrying out the above process will be described below.

The pickup apparatus 100 is provided with a first table 42 movable in an X direction, a second table 44 movable in a Y direction perpendicular to the X direction (in a direction perpendicular to the paper face) on the first table 42, and a third table 49 that can be rotate by itself at a predetermined angle. An arm 50 is vertically formed on the third table 49, and a table 52 in a doughnut (ring) shape is formed in an integrated manner with the upper end of the arm 50.

A fixing jig 3 is disposed in such a manner that the fixing jig 3 seals an opening 55 formed in the table 52 in a doughnut shape. A positioning pin 57 is formed on the fixing jig 3 in advance, and a groove 59 is formed in the table 52 in a doughnut shape. The fixing jig 3 is positioned and fixed to the table 52 in a doughnut shape by detachably inserting the pin 57 into the groove 59.

A uniaxial robot 60 that can be moved in only a vertical direction is disposed over the third table 49, and a suction means V is disposed on the end of the uniaxial robot 60. The suction means V is connected to a vacuum pump (not shown). The uniaxial robot 60 is moved upward at a predetermined timing, and the suction means V contacts to the lower face of the fixing jig 3, whereby the predetermined small chambers 15 can be connected to the vacuum pump. Consequently, only the spaces of the predetermined small chambers 15 can be suctioned, and only the contact layer 31 at the positions of the small chambers 15 can be deformed.

Moreover, a suction collet 70 is disposed above the fixing jig 3. The suction collet 70 can also be moved in a vertical direction. The suction part 70a suctions the chip 13' at a predetermined timing, and can pick up the chip 13'.

For the above described pickup apparatus 100, the first table 42 and the second table 44 are moved in an X direction and in a Y direction, and the third table 49 is rotated at a predetermined angle in a θ direction to position the fixing jig 3 to the suction collet 70. Consequently, by detecting the position of the fixing jig 3 by a sensor (not shown), any of the chip 13 can be positioned directly under the suction collet 70.

The suction collet 70 can be moved in a vertical direction and in a horizontal direction. Consequently, the suction collet 70 can invert the chip 13' that has been picked up as needed, transfer the chip 13' to a die bonding step, and transfer the chip 13' in a chip tray.

As described above, the pickup apparatus 100 in accordance with an embodiment of the present invention does not require the pushing up of a chip using a fine needle. Consequently, the chip 13 is not damaged, and a high quality chip can be supplied to the next step. Moreover, in the case in which one chip 13 is picked up, other chips 13 are not affected, thereby enabling only one chip to be reliably picked up.

While the preferred embodiments in accordance with the present invention have been described above, the present invention is not restricted to the above embodiments. For instance, a protrusion having a height equivalent to that of the partition 12 is formed vertically in the small chamber 15 sectioned by the partition 12, and the top part of the protrusion can hold a chip. By forming such a protrusion, even a large chip can be held in a stable state.

In the above embodiment, a size of one chip 13 is corresponded to a size of four small chambers 15. For instance, a size of one chip can be set to be corresponded to a size of six small chambers 15. Consequently, in the case in which a size of one small chamber 15 sectioned by the partition 12 is set to be smaller, chips of a variety of sizes can be applied. More specifically, a suction part 70a of the collet and a head part of the vacuum apparatus V are prepared corresponding to a size of a chip to be picked up, and the suction part 70a of the collet as well as the head part of the vacuum apparatus V is exchanged in the case in which a size of the chip is switched. Consequently, a chip having a targeted size can be picked up.

The invention claimed is:

1. A fixing jig comprising a jig base and a contact layer, wherein a concave part is formed on one side of the jig base, the concave part is sectioned into small chambers by a partition having a height almost equivalent to that of a sidewall, the contact layer is bonded to an upper edge of the sidewall and the partition for covering the concave part, and a through hole that is communicated with the outside is formed in each small chamber.

2. A method for picking up a chip fixed to the fixing jig as defined in claim 1, comprising the steps of:
    fixing a chip in a state in which a chip group in a wafer shape is fixed to the contact layer;
    deforming the contact layer that covers an aimed small chamber by suctioning an air in the small chamber through the through hole of the small chamber in the fixing jig; and
    suctioning the chip on the section in which the small chamber is suctioned and the contact layer is deformed by means of a suction collet to pick up the suctioned chip completely from the contact layer.

3. A pickup apparatus that is used in the chip pickup method as defined in claim 2, comprising:
    a suction means that is disposed on one opening side of a through hole formed in a thickness direction of the jig base;
    a suction collet that is disposed on the other opening side of the through hole; and
    a table in a doughnut shape that detachably fixes the outer circumference of the jig base,
    wherein the suction means suctions any of the small chamber in the jig base that is detachably held by the table in a doughnut shape and the suction collet suctions a chip.

* * * * *